(12) United States Patent
Matayabas, Jr. et al.

(10) Patent No.: US 7,408,787 B2
(45) Date of Patent: *Aug. 5, 2008

(54) PHASE CHANGE THERMAL INTERFACE MATERIALS INCLUDING POLYESTER RESIN

(75) Inventors: James Christopher Matayabas, Jr., Chandler, AZ (US); Paul A. Koning, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 286 days.

This patent is subject to a terminal disclaimer.

(21) Appl. No.: 10/631,912

(22) Filed: Jul. 30, 2003

(65) Prior Publication Data

US 2005/0041406 A1    Feb. 24, 2005

(51) Int. Cl.
*H05K 1/11* (2006.01)
*H05K 1/14* (2006.01)
(52) U.S. Cl. .................. 361/784; 361/704; 361/710
(58) Field of Classification Search ......... 361/767–770; 428/323–329, 447
See application file for complete search history.

(56) References Cited

U.S. PATENT DOCUMENTS

| 5,706,579 | A  | * | 1/1998 | Ross ........................ 29/840 |
| 5,747,560 | A  |   | 5/1998 | Christiani et al. |
| 6,114,413 | A  | * | 9/2000 | Kang et al. .................. 523/210 |
| 6,565,701 | B1 | * | 5/2003 | Jerabek et al. ............... 156/305 |
| 6,620,515 | B2 | * | 9/2003 | Feng et al. .................. 428/447 |
| 6,924,027 | B2 | * | 8/2005 | Matayabas et al. ........... 428/323 |
| 6,937,454 | B2 | * | 8/2005 | Mikolajczak et al. ........ 361/111 |
| 7,015,786 | B2 | * | 3/2006 | Ramarge et al. .............. 338/20 |
| 7,022,407 | B2 | * | 4/2006 | Furuya et al. ............... 428/331 |
| 2002/0135984 | A1 |   | 9/2002 | Greenwood et al. |
| 2003/0100654 | A1 |   | 5/2003 | Chheang et al. |
| 2004/0077773 | A1 | * | 4/2004 | Tavares et al. .............. 524/507 |

FOREIGN PATENT DOCUMENTS

EP    1 067 164 A    1/2001
WO    WO 02/081592 A    10/2002

OTHER PUBLICATIONS

PCT Search Report, International Application No. PCT/US2004/024269, Filing Date Jul. 28, 2004, mailing date Dec. 6, 2004 (7 pages).
PCT Written Opinion of the International Searching Authority, International Application No. PCT/US2004/024269, Filing Date Jul. 28, 2004. mailing date Dec. 6, 2004 (7 pages).

* cited by examiner

*Primary Examiner*—Tuan T Dinh
(74) *Attorney, Agent, or Firm*—Kathy J. Ortiz

(57) ABSTRACT

An embodiment of a phase change TIM of this invention comprises a polyester matrix with melting temperature near or below operating temperature (typically less than about 130° C.), thermally conductive filler with bulk thermal conductivity greater than about 50 W/mK, and optionally other additives. The polyester resin has improved thermo-oxidative stability compared to the polyolefin resins, thereby providing improved reliability performance during test.

18 Claims, 3 Drawing Sheets

PHASE CHANGE THERMAL INTERFACE MATERIALS INCLUDING POLYESTER RESIN

BACKGROUND OF THE INVENTION

1). Field of the Invention

This invention relates to phase change thermal interface materials (TIM's) comprising polyester resins and electronic devices with such TIM's.

2). Discussion of Related Art

Today's semiconductor devices, whether discrete power or logic integrated circuits, are smaller, run faster, do more and generate more heat. Due to increased power, some desktop microprocessors dissipate heat in the range of 50 to 100 watts. These power levels require thermal management techniques involving large-capacity heat sinks, good air flow, and careful management of thermal interface resistances. A well-designed thermal management program will keep operating temperatures within acceptable limits in order to optimize device performance and reliability.

Semiconductor devices are kept within their operating temperature limits by transferring junction-generated waste heat to the ambient environment, such as the surrounding room air. This is best accomplished by attaching a heat sink to the semiconductor package surface, thus increasing the heat transfer between the hot case and the cooling air. A heat sink is selected to provide optimum thermal performance. Once the correct heat sink has been selected, it must be carefully joined to the semiconductor package to ensure efficient heat transfer through this newly formed thermal interface.

Thermal materials have been used to join a semiconductor package and a heat sink, and to dissipate the heat from the semiconductor devices, such as microprocessors. A TIM typically comprises a polymer matrix and a thermally conductive filler. The TIM technologies used for electronic packages encompass several classes of materials such as epoxies, greases, gels, and phase change materials.

Metal filled epoxies commonly are highly conductive materials that thermally cure into highly crosslinked materials. However, metal filled epoxies exhibit localized phase separation due to package thermo-mechanical behavior and their high modulus leads to delamination at the interfaces.

Thermal greases display good wetting and ability to conform to the interfaces, no post-dispense processing, and high-bulk thermal conductivity. However, greases tend to migrate out from between the interfaces under cyclical stresses encountered during temperature cycling, a phenomenon known as "pump out."

Gels typically comprise a crosslinkable silicone polymer, such as vinyl-terminated silicone polymer, a crosslinker, and a thermally conductive filler. After cure, gels are crosslinked filled polymers, and the crosslinking reaction provides cohesive strength to circumvent pump-out issues exhibited by greases during temperature cycling. Their modulus (E') is low enough so that the material can still dissipate internal stresses and prevent interfacial delamination, but not low enough to survive the reliability-stressing test.

Phase change materials (PCMs) are in a class of materials that undergo a transition from a solid to a liquid phase with the application of heat. These materials are in a solid state at room temperature and are in a liquid state at die operating temperatures. When in the liquid state, PCMs readily conform to surfaces and provide low thermal interfacial resistance. PCMs offer ease of handling and processing due to their availability in a film form and the lack of post-dispense processing. However, from a formulation point, the polymer and filler combinations that have been utilized in PCMs restrict the bulk thermal conductivities of these materials. In general pump-out, bleed-out, and dry-out are continuing reliability issues for phase change TIMs. Commercial phase change thermal interface materials (such as Chomerics T454) are polyolefin-based. Because of their hydrocarbon chemical structure, polyolefins rapidly degrade in oxygen above about 125° C., with a corresponding increase in thermal resistance (Rja); see FIG. 1. This presents a high risk for thermo-oxidative degradation over time at operating temperatures below about 110° C. and is a show-stopper for applications with operating temperatures above 110° C.

BRIEF DESCRIPTION OF THE DRAWINGS

The invention is described by way of examples with reference to the accompanying drawings, wherein.

DETAILED DESCRIPTION OF THE INVENTION

Figure 1:
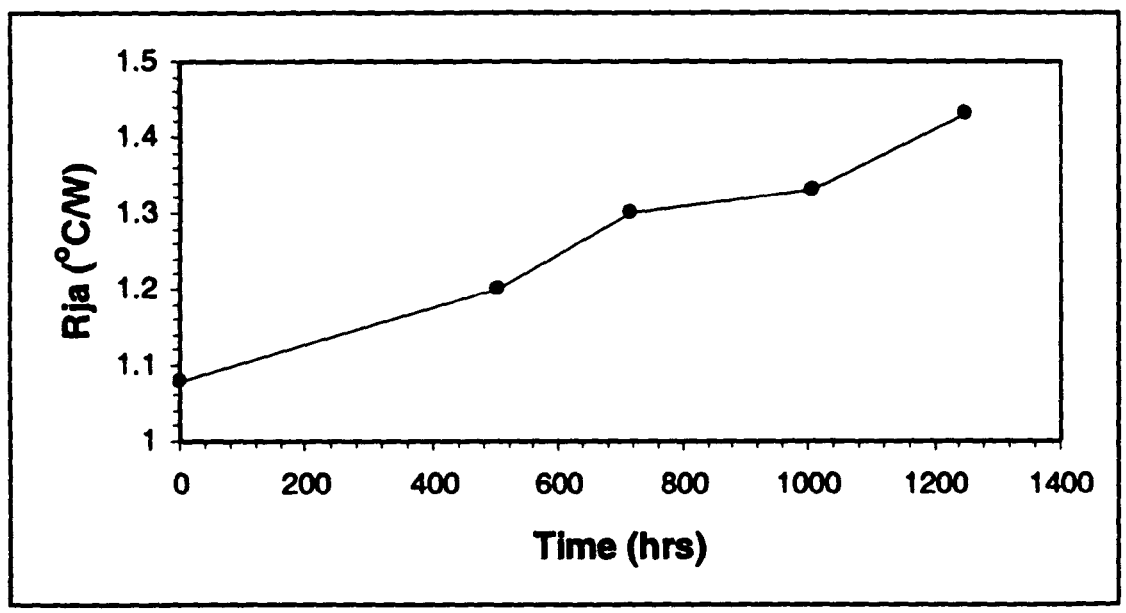
FIG. 1 is a graph of Rja vs. time of bake at 125° C. for a test vehicle comprising a conventional Chomerics T454 phase change material.

This invention provides a base resin that has form and function similar to that of current polyolefins, yet provides significantly improved thermo-oxidative stability, which provides a thermal solution for applications with high junction temperatures (Tj's) and provides improved bake stability for applications with lower Tj's.

General Formulation

An embodiment of a phase change TIM of this invention comprises a polyester matrix with melting point near or below the operating temperature (typically less than about 130° C.), thermally conductive filler with bulk thermal conductivity greater than about 50 W/mK, and optionally other additives.

The polyester resin has improved thermo-oxidative stability compared to the polyolefin resins, thereby providing improved reliability performance, especially during bake and HAST testing.

The phase change TIM's can be used in a wide variety of applications. They are especially useful as thermal interface material between an electronic package and a heat sink or heat plate. They can be used for a variety of electronic packages, including organic flip-chip, ceramic flip-chip, and wirebonded packages. Optionally, the package may comprise a heat sink and another thermal interface material between the die and the heat sink. The TIM's may be used as the first-level TIM (between the die and a heat spreader), as the second-level TIM (between the heat spreader and heat sink), and as the TIM for a bare die (between the die and heat plate or heat sink). The electronic devices of this invention have improved reliability performance.

The phase change thermal interface materials (PCM's) comprise one or more polyester matrix polymers, one or more thermally conductive fillers, and optionally other additives. The PCM's are useful as thermal interface materials for removing heat from semiconductor components, and they have improved reliability performance resulting from improved thermo-oxidative stability of the polyester resin.

It is preferred that polyester resin have a melting point slightly above room temperature (i.e., about 40° C.), yet below the operating temperature of the electronic device (typically less than about 130° C.). If desired, the polyester resin may comprise reactive groups for crosslinking. Polycaprolactone is a preferred polyester resin. If desired, other resins may be included to modify/control desired properties, such as modulus, viscosity, and moisture adsorption. Examples of resin additives include polyolefins, polystyrenes, polyacrylates, polyamides, polyimides, polyarylates, epoxies, and the like, or their mixtures.

The thermally conductive filler should preferably have bulk thermal conductivity greater than about 50 W/mK. Examples of useful fillers include ceramics, such as zinc oxide, aluminum oxide, boron nitride, aluminum nitride, and the like; metals, such as aluminum, copper, silver, and the like; solders, such as indium, tin, and the like; and their combinations. Typically, the amount of thermally conductive filler is about 10 to 90 percent by weight (wt %), depending on such factors as the desired bulk thermal conductivity and the selection of the fillers.

Examples of useful additives include surfactants, coupling agents, adhesion modifiers, wetting agents, colorants, stabilizers, and the like. Organoclay materials may be included to further improve thermo-oxidative stability and decrease diffusion of gases and small molecules for still further reliability improvement.

The PCM's may be mixed by a wide variety of processes, including batch, semi-continuous, and continuous processes, optionally with use of a solvent or a dilutant. In one embodiment of this invention, the PCM is prepared as thin film with a backing layer and a release layer as a drop-in replacement for the current form and function of PCM's known in the art today.

EXAMPLES

Example 1

Figure 2:
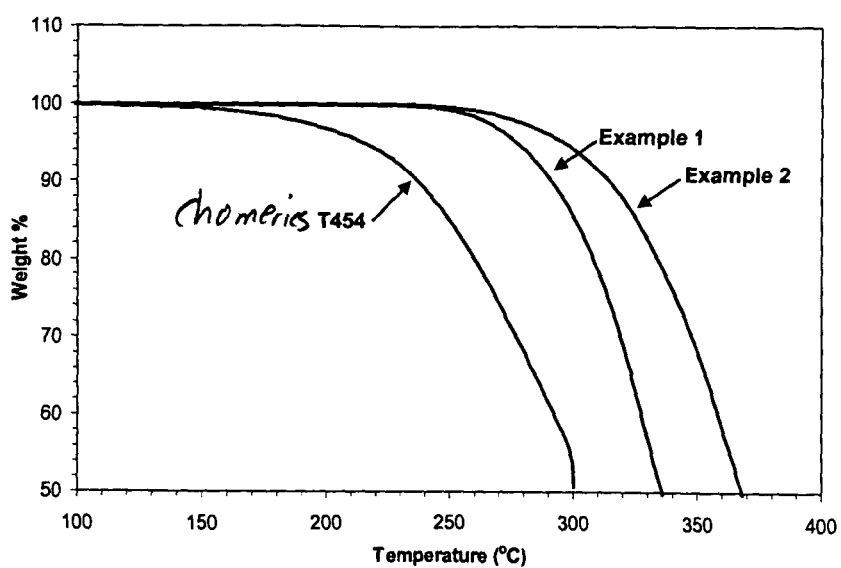
FIG. 2 is a graph of thermographic material (TGA) in air showing improved thermo-oxidative stability for the polyester resins in Examples 1 and 2 compared to the polyolefin-based commercial material T454 from Chomerics.

This example is representative of a polyester-based phase change thermal interface material that has significantly improved thermo-oxidative stability: 50 grams of toluene, 50 grams of polycaprolactone (POLYOL 1278® from Dow Chemical Company, Inc.) with a melting point of 50° C., and 50 grams of BN are mixed at 80° C. in a Ross double planetary mixer for 3 hrs. The material is cast onto 3-mil thick Mylar® film and dried at 100° C. to a final thickness of about 13 mils. The material is evaluated by an interfacial tester at 90 psi and 90° C. and found to have a thermal resistance of 0.1° C. $cm^2$/W. As illustrated in FIG. 2, TGA analysis in air shows that the material begins to degrade above about 200° C., with significant degradation occurring after about 300° C.

Example 2

This example is representative of a polyester organoclay nanocomposite-based phase change thermal interface material that has significantly improved thermo-oxidative stability: 50 grams of toluene, 49 grams of polycaprolactone (POLYOL 1278® from Dow Chemical Company, Inc.) with a melting point of 50° C., 49 grams of BN, and 2 grams of organoclay (Nanomer® I.30 P from Nanocor, Inc.) are mixed at 80° C. in a Ross double-planetary mixer for 3 hours. The material is cast onto 3-mil-thick Mylar® film and dried at 100° C. to a final thickness of about 13 mils. The material is evaluated by an interfacial tester at 90 psi and 90° C. and found to have a thermal resistance of 0.1° C. $cm^2$/W. As illustrated in FIG. 2, TGA analysis in air shows that the material begins to degrade above about 200° C., with significant degradation occurring after about 320° C.

Comparative Example

This example is representative of a polyolefin-based phase change thermal interface material: 50 grams of toluene, 50 grams of alpha-olefin resin (ADMER® AT1030A from Mitsui Chemicals America, Inc.) with a softening point of 59° C., and 50 grams of BN are mixed at 80° C. in a Ross double-planetary mixer for 3 hours. The material is cast onto 3-mil-thick Mylar® film and dried at 100° C. to a final thickness of about 13 mils. The material is evaluated by an interfacial tester at 90 psi and 90° C. and found to have a thermal resistance of 0.1° C. $cm^2$/W. As illustrated in FIG. 2, TGA analysis in air shows that the material begins to degrade above about 100° C., with significant degradation occurring after about 200° C.

Semiconductor Package

The following figures refer to apparatus and methods for a heat transfer apparatus adapted to be used on a semiconductor or an electronic device such as, but not limited to, a microprocessor for use in a computer. The scope of the invention is not to be limited to microprocessors specifically, nor computer assemblies in general. The scope of the invention includes, but is not limited to, any device or apparatus requiring the benefits of a heat transfer apparatus that includes a thermal interface material of this invention.

Figure 3:
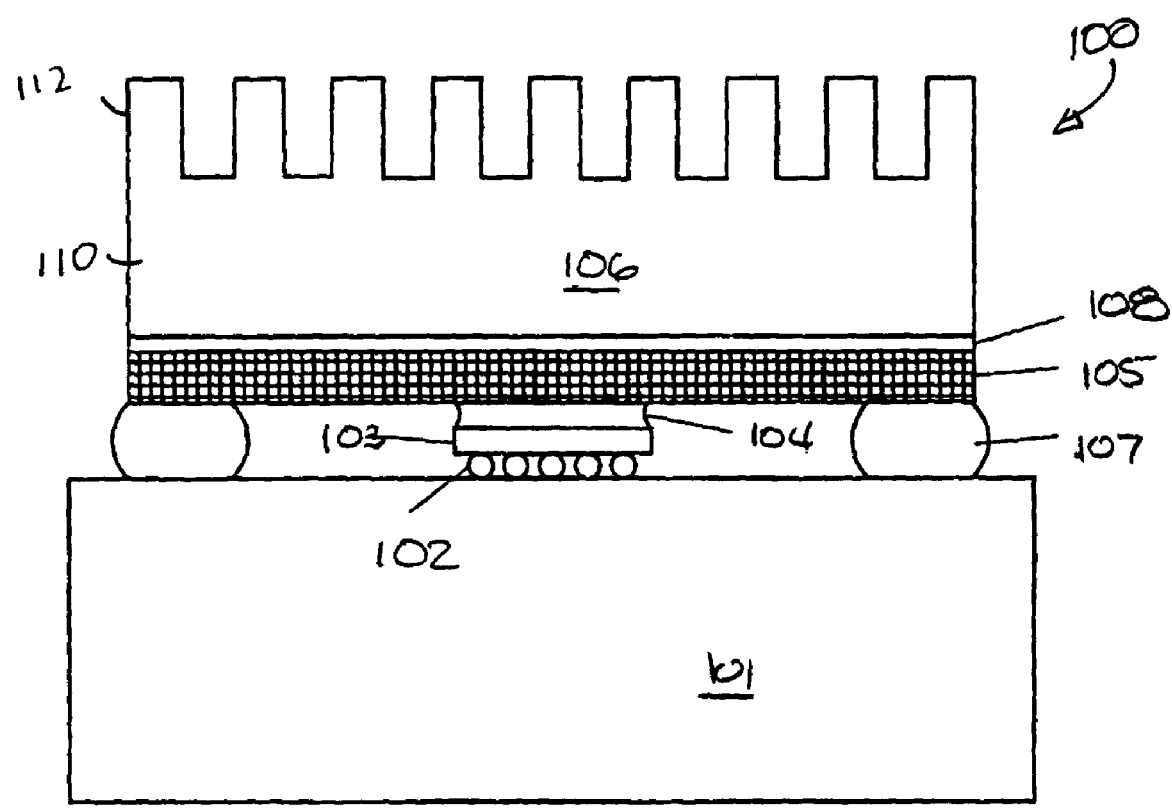
FIG. 3 is a cross-sectional view of a semiconductor package that uses an embodiment of a thermal interface material of the invention.

FIG. 3 illustrates a cross-sectional view of a semiconductor package 100 which uses an embodiment of the invention. The semiconductor package 100 includes a substrate 101, having a semiconductor device 103 mounted on a top surface of the substrate 101. The semiconductor device 103 is a microelectronic die having an integrated circuit formed therein. In one embodiment, the substrate 101 is a printed circuit board. In another embodiment, the substrate 101 may be a different material, such as silicon or ceramic.

The semiconductor device 103 is mechanically and electrically coupled to the top surface of the substrate 101 via a plurality of solder bump connections 102. In some embodiments, the gap may be filled with an epoxy underfill material (not shown). The substrate 101 contains at least one wiring layer (not shown) that electrically connects the device to pins or balls located along the bottom surface of the substrate 101. The solder balls 102 are placed in an array and are commonly referred to as a ball grid array. Because the semiconductor device 103 is flipped into place so the solder balls 102 electrically and mechanically connect to pads or lands in the substrate 101, the semiconductor device 103 is sometimes referred to as a flip-chip.

A first thermal plate in the form of a heat spreader 105 is thermally coupled to the major surface of the semiconductor device 103 that does not carry solder balls 102 through a compliant heat-transfer medium 104 known as a thermal interface material. In one embodiment, the thermal interface material is a nanocomposite phase change thermal interface material that includes one or more matrix polymers, one or more thermally conductive fillers, and one or more clay materials. The nanocomposite phase change material 104 fills small voids in the major surface of the back side of the semiconductor device 103 (the major surface without solder balls) and the corresponding surface of the heat spreader 105 to which the semiconductor device 103 is attached. The back side of the semiconductor device 103 and the surface of the heat spreader 105 to which the semiconductor device 103 is attached is a thermal interface.

The heat spreader 105 is further attached to the substrate using a sealant material 107. The sealant material 107 surrounds the device 103 and fills the gap between the substrate 101 and the heat spreader 105, forming a completely enclosed cavity containing the device 103. The use of the sealant material 107 allows for a more flexible bond between the substrate 101 and the heat spreader 105. In one embodiment, the sealant material may be silicone or another sealant material. The flexible bond can help to compensate for differing coefficients of thermal expansion (CTE) between the heat spreader 105 and the substrate 101, resulting in a more consistent heat conduction pathway. In other embodiments, the sealant material is replaced with a contiguous wall of metal. The use of the sealant material 107 shown results in a lighter semiconductor package 100 than one where the sealant material is replaced with a wall of metal.

A heat sink 106 is attached to the heat spreader 105 at another thermal interface using a thermal interface material 108. The heat spreader 106 includes a second thermal plate 110 and a plurality of fins 112 extending from the second thermal plate 110. In one embodiment, the thermal interface material 108 is the same material as the thermal interface material 104. In another embodiment, the thermal interface material 108 is a different nanocomposite phase change thermal interface material that includes one or more matrix polymers, one or more thermally conductive fillers, and one or more clay materials. The heat sink 106 allows for the more rapid dissipation of heat due to increased surface area for cooling. It should be noted that in some embodiments, one of the thermal interface material 104 and the thermal interface material 108 may not be a nanocomposite phase change thermal interface material that includes one or more matrix polymers, one or more thermally conductive fillers, and one or more clay materials. One of the thermal interface materials can be another type of thermal interface material. Thermal interface materials typically include a polymer matrix and a thermally conductive filler, and encompass several classes of materials such as epoxies, greases, gels, and phase change materials. It should also be noted that FIG. 3 is one example of a package 100 that uses a thermal interface material 104, 108 and that there are other types of packages. Furthermore, it should be noted that the thickness of the thermal interface material 104 and the thickness of the thermal interface material 108, as shown in FIG. 1, are thick for the purpose of illustrating the position of the thermal interface materials 104 and 108. The resistance to heat transfer across a thermal interface, as shown by the following equations and text, is directly proportional to the thickness of the interface. Therefore, for the sake of thermal efficiency, it is desirable to make the thermal interface as thin as possible.

Another common style of semiconductor package is similar to that shown in FIG. 1. In this style of package (sometimes known as bare die), the heat spreader 104 and thermal interface material 108 are omitted and a thermal plate portion of the heat sink is in direct contact with the TIM material 104.

The rate of conductive heat transfer, Q, across the interface is given by:

$$Q = \frac{kA(Tc - Ts)}{L}$$

where k is the thermal conductivity of the interface, A is the heat transfer area, L is the interface thickness and Tc and Ts are the device case and heat sink temperatures. The thermal resistance of a joint, Rc-s, is given by $$Rc - s = \frac{(Tc - Ts)}{Q}$$

and on rearrangement, $$Rc - s = \frac{L}{kA}$$

Thus, the thermal resistance of the joint is directly proportional to the joint thickness and inversely proportional to the thermal conductivity of the medium making up the joint and to the size of the heat transfer area. Thermal resistance is minimized by making the joint as thin as possible, increasing joint thermal conductivity by eliminating interstitial air, and making certain that both surfaces are in intimate contact.

Attaching a heat sink to a semiconductor package requires that two solid surfaces be brought together into intimate contact. Unfortunately, no matter how well-prepared, solid surfaces are never really flat or smooth enough to permit intimate contact. All surfaces have a certain roughness due to microscopic hills and valleys. Superimposed on this surface roughness is a macroscopic non-planarity in the form of a concave, convex, or twisted shape. As two such surfaces are brought together, only the hills of the surfaces come into physical contact. The thermal interface material must be thin and must also fill the valleys that are separated and form air-filled gaps.

Addition of Clay

The nanocomposite phase change materials used as thermal interface materials may include one or more clay materials. By exfoliating the clay into the thermal interface material, the clay particles become dispersed as very small platelets with a high aspect ratio (typically greater than 200) and a high surface area. Because of the high aspect ratio and surface area, very minor amounts of clay, typically less than 10 wt %, are required, and as little as 0.5 wt % provides significant, desired improvements in the thermal interface material. The clay particles improve the reliability and performance of TIM materials by slowing diffusion of oxygen and water through the thermal interface material. The resulting nanocomposite phase change material has improved high-acceleration stress test ("HAST") performance, and slows the release of volatile components for reduced pump-out, bleed-out, and dry-out of the thermal interface material. The clay particles also improve the thermo-oxidative stability of the TIM for improved bake and thermal cycling ("TC") performance.

The PCM's of the present invention may comprise less than about 25 weight percent, preferably less than about 5 weight percent of clay materials that comprise platelet particles. Generally, the clay materials useful in this invention are an agglomeration of individual platelet particles that are closely stacked together like cards, in domains called tactoids. The individual platelet particles of the clays preferably have a thickness of less than about 2 nm and a diameter greater than about 10 nm, typically about 10 to about 3000 nm. Useful clay materials include natural, synthetic, and modified phyllosilicates. Natural clays include smectite clays, such as montmorillonite, saponite, hectorite, mica, vermiculite, bentonite, nontronite, beidellite, volkonskoite, magadite, kenyaite, and the like. Synthetic clays include synthetic mica, synthetic saponite, synthetic hectorite, and the like. Modified clays include fluoronated montmorillonite, fluoronated mica, and the like. Moreover, the layered clay materials are typically swellable free-flowing powders having a cation exchange capacity from about 0.3 to about 3.0 milliequivalents per gram of mineral (meq/g), preferably from about 0.90 to about 1.5 meq/g.

In an embodiment of this invention, an intercalated layered clay material is prepared by the reaction of a swellable layered clay with one or more organic cations, preferably ammonium compounds, to effect partial or complete cation exchange. Numerous methods to modify layered clays with organic cations are known, and any of these may be used in the practice of this invention. One embodiment of this invention is the organic modification of a layered clay with an organic cation salt by the process of dispersing a layered clay or mixture of clays into hot water (50 to 80° C.), adding the organic cation salt (neat or dissolved in water or alcohol) with agitation, then blending for a period of time sufficient for the organic cations to exchange most of the metal cations present in the galleries between the layers of the clay material(s). Then, the organically modified layered clay material(s) is isolated by methods known in the art, including filtration, centrifugation, spray drying, and their combinations. Typically, the organoclay is reduced in particle size to less than about 100 microns by methods known in the art, including milling, grinding, pulverizing, hammer milling, jet milling, and their combinations.

The clay may be further treated for the purposes of aiding exfoliation in the composite and/or improving the strength of the polymer/clay interface. Any treatment that achieves the above goals may be used. Examples of useful treatments include intercalation with water-soluble or water-insoluble polymers, organic reagents or monomers, silane compounds, metals or organometallics, and/or their combinations.

Preferably, the clays are dispersed in the formulation so that most of the clay material exists as individual platelet particles, small tactoids, and small aggregates of tactoids with dimensions of less than about 20 nm. Compositions with the higher concentration of individual platelet particles and fewer tactoids or aggregates are preferred. Without being bound by any particular theory, it is believed that the improved properties of the materials of this invention are derived by the unique property of the platelet particles to reduce diffusion of gasses and low molecular weight components through the material.

Figure 4:
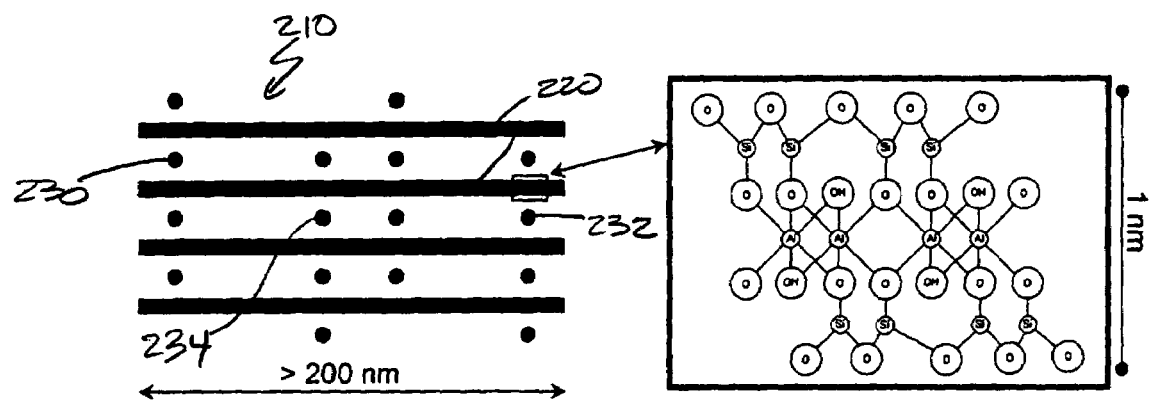
FIG. 4 is a schematic representation of layered clay material useful in an embodiment of a thermal interface material of the invention.

FIG. 4 is a schematic representation of layered clay material 210 useful in an embodiment of a thermal interface material of the invention. The clay forms layers having aspect ratios of approximately 200. As shown in FIG. 4, the thickness of a layer 220 of clay is approximately 1 nm. The length of the layer 220 of clay is approximately 200 nm. FIG. 4 also shows the structure of a clay used in one embodiment of the invention. The layers of clay, such as layer 220, reduce the rate of diffusion of gases and low molecular weight components through the nanocomposite phase change material forming the thermal interface material. The gases and low molecular weight components are depicted as small round objects, such as 230, 232, and 234 in FIG. 2.

Figure 5:
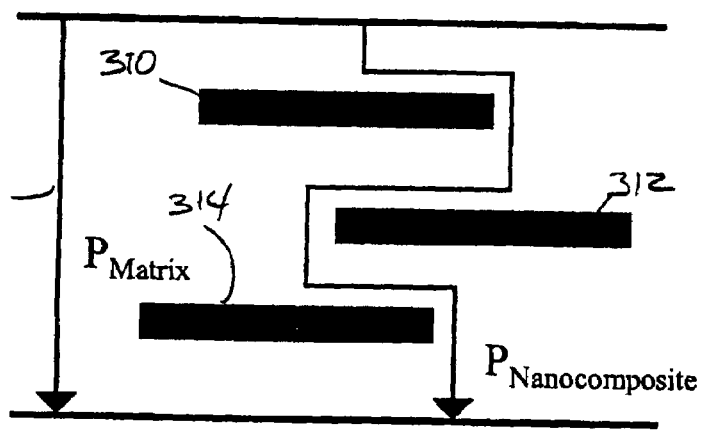
FIG. 5 is a schematic view of the platelets of clay and the tortuous path created by the platelets of clay that result in barrier improvement in the nanocomposite, according to an embodiment of this invention.

FIG. 5 is a schematic view of the platelets of clay which form layers of clay, and the tortuous path created by the platelets of clay that result in barrier improvement in the nanocomposite, according to an embodiment of this invention. One theory for explaining the improvements is the tortuous path theory, in which the permeant, such as the gases and low molecular weight components depicted by reference numbers 230, 232, and 234 in FIG. 4, is said to have to permeate a longer distance due to the presence of the platelet particles with a large aspect ratio. FIG. 5 shows three layers or platelets of clay 310, 312, and 314. The length of the path through the material without the platelets is depicted by $P_{Matrix}$. The length of the path through the material with the platelets 310, 312, and 314 is depicted by $P_{Nanocomposite}$. In short, the platelets 310, 312, and 314 create a tortuous path that lengthens the path length of $P_{Nanocomposite}$ when compared to $P_{Matrix}$.

There is also an equation for the tortuous path mechanism for barrier improvement, which is as follows:

$$P_{Nanocomposite} = \frac{(\text{Matrix Volume Fraction}) * (P_{matrix})}{1 + (\text{platelet Volume Fraction}) * (\text{Platelet Aspect Ratio})/2}$$

where, $P_{Matrix}$ is the permeability of the matrix material alone $P_{Nanocomposite}$ is the permeability of the nanocomposite formulation Matrix Volume Fraction is the volume fraction of matrix (e.g., polymer and organic additives)

Platelet Volume Fraction is the volume fraction of clay Material

Platelet Aspect Ratio is a measure of the average diameter to length of the platelet While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic package, comprising:
   a first device including a microelectronic die having an integrated circuit;
   a second device including a first thermal plate; and
   a thermal interface material between and in contact with surfaces of the first and second devices, the thermal interface material including:
   at least one polyester matrix material;
   at least one thermally conductive filler dispersed within the thermal interface material; and
   less than about 10% by weight of one or more clay materials, wherein individual platelet particles of the clay have a thickness of less than 2 nm and a diameter between about 10 nm and about 3,000 nm.

2. The electronic package of claim 1, wherein the thermal interface material comprises a phase change material.

3. The electronic package of claim 1, wherein the thermal interface material has improved thermo-oxidative stability compared to a polyolefin resin.

4. The electronic package of claim 1, wherein the thermal interface material further includes at least one additive to modify at least one of modulus, viscosity, and moisture adsorption.

5. The electronic package of claim 1, wherein the thermally conductive filler has a bulk thermal conductivity greater than about 50 W/mK.

6. The electronic package of claim 1, wherein the thermally conductive filler includes at least one of a ceramic, a metal, and a solder.

7. The electronic package of claim 1, wherein the thermally conductive filler includes at least one of zinc oxide, aluminum oxide, boron nitride, aluminum nitride, aluminum, copper, silver, indium, and tin.

8. The electronic package of claim 1, wherein the thermally conductive filler comprises between about 10% and about 90% of the thermal interface material by weight.

9. The electronic package of claim 1, wherein the thermally conductive filler further includes at least one of a surfactant, coupling agent, adhesion modifier, wetting agent, colorant, and stabilizer.

10. The electronic package of claim 1, wherein the clay further includes an organoclay.

11. The electronic package of claim 1, wherein the thermal interface material comprises layers of the clay, and wherein an individual layer of the clay comprises a thickness of about 1 nm.

12. The electronic package of claim 1, wherein the clay includes at least one of montmorillonite, saponite, hectorite, mica, vermiculite, bentonite, nontronite, beidellite, volkonskoite, magadite, kenyaite, mica, synthetic saponite, synthetic hectorite, fluoronated montmorillonite, and fluoronated mica.

13. The electronic package of claim 1, wherein the thermal interface material contacts the die on one side and the thermal plate on an opposing side.

14. The electronic package of claim 1, wherein the first device includes a second thermal plate thermally coupled to the die, the thermal interface material contacting the second thermal plate on one side and the first thermal plate on an opposing side.

15. The electronic package of claim 2, wherein the phase change material has a melting point between about 40° C. and about 130° C.

16. The electronic package of claim 4, wherein the at least one additive comprises a resin.

17. The electronic package of claim 4, wherein the at least one additive comprises at least one of polyolefin, polystyrene, polyacrylate, polyamide, polyimide, polyarylate, and epoxy.

18. The electronic package of claim 10, wherein the clay is a swellable free-flowing powder having a cation exchange capacity from about 0.3 to about 3.0 milliequivalents per gram of mineral (meq/g).

* * * * *